US006913994B2

(12) United States Patent
Guo et al.

(10) Patent No.: US 6,913,994 B2
(45) Date of Patent: Jul. 5, 2005

(54) METHOD TO FORM CU/OSG DUAL DAMASCENE STRUCTURE FOR HIGH PERFORMANCE AND RELIABLE INTERCONNECTS

(75) Inventors: Qiang Guo, Singapore (SG); Ahila Krishnamoorthy, Singapore (SG); Xiaomei Bu, Singapore (SG); Vladimir N. Bliznetsov, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 218 days.

(21) Appl. No.: 10/410,122

(22) Filed: Apr. 9, 2003

(65) Prior Publication Data

US 2004/0203223 A1 Oct. 14, 2004

(51) Int. Cl.[7] .................... H01L 21/4763; H01L 21/302
(52) U.S. Cl. ....................... 438/638; 438/706; 438/725; 438/745
(58) Field of Search ................. 438/637–640, 438/706, 725, 745

(56) References Cited

U.S. PATENT DOCUMENTS

| | | | |
|---|---|---|---|
| 6,107,192 A | 8/2000 | Subrahmanyan et al. ... | 438/637 |
| 6,168,726 B1 | 1/2001 | Li et al. ........................ | 216/79 |
| 6,277,733 B1 * | 8/2001 | Smith ........................... | 438/636 |
| 6,331,479 B1 | 12/2001 | Li et al. ....................... | 438/618 |
| 6,410,426 B1 | 6/2002 | Xing et al. ................... | 438/638 |
| 6,410,437 B1 | 6/2002 | Flanner et al. ............... | 438/689 |
| 6,426,304 B1 | 7/2002 | Chien et al. ................. | 438/727 |
| 6,579,791 B1 * | 6/2003 | Tu et al. ...................... | 438/637 |
| 6,720,256 B1 * | 4/2004 | Wu et al. ..................... | 438/638 |

* cited by examiner

Primary Examiner—Ha Tran Nguyen
(74) Attorney, Agent, or Firm—George O. Saile; Stephen B. Ackerman

(57) ABSTRACT

An improved method of forming a dual damascene structure that includes an organosilicate glass (OSG) dielectric layer is described. A via first process is followed in which a via is formed in the OSG layer and preferably stops on a SiC layer. The SiC layer is removed prior to stripping a photoresist containing the via pattern. A planarizing BARC layer is formed in the via to protect the exposed substrate from damage during trench formation. The method provides higher Kelvin via and via chain yields. Damage to the OSG layer at top corners of the via and trench is avoided. Furthermore, there is no pitting in the OSG layer at the trench bottom. Vertical sidewalls are achieved in the via and trench openings and via CD is maintained. The OSG loss during etching is minimized by removing the etch stop layer at an early stage of the dual damascene sequence.

30 Claims, 7 Drawing Sheets

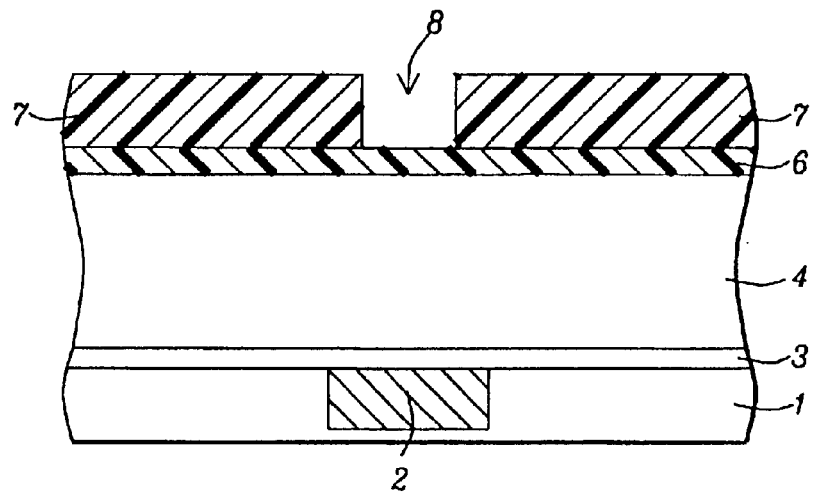
FIG. 1a – Prior Art
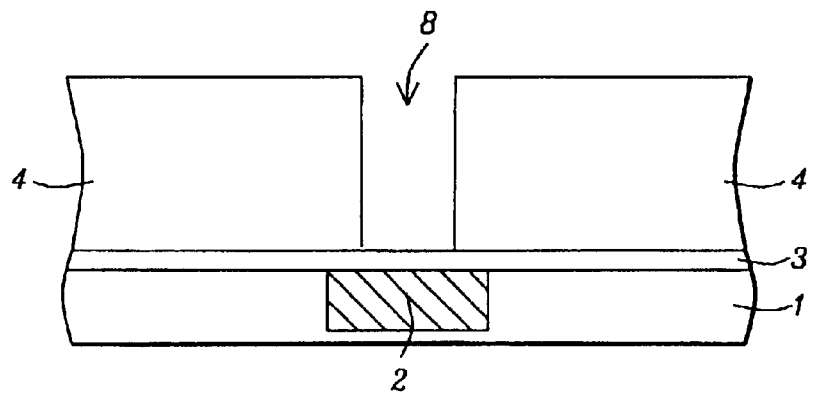
FIG. 1b – Prior Art
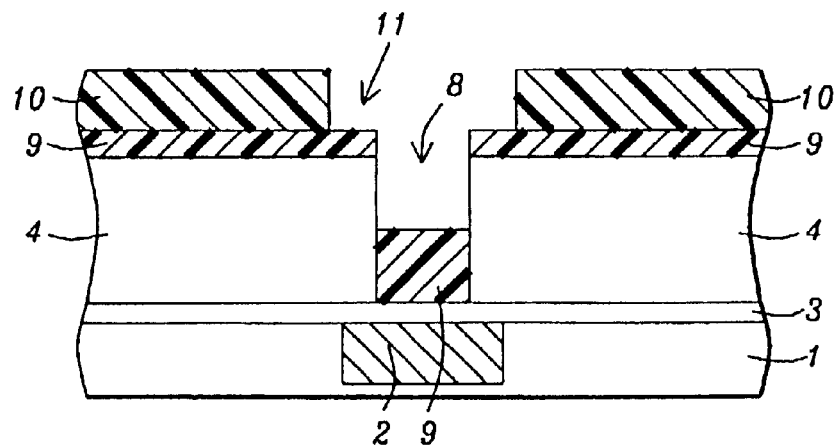
FIG. 1c – Prior Art

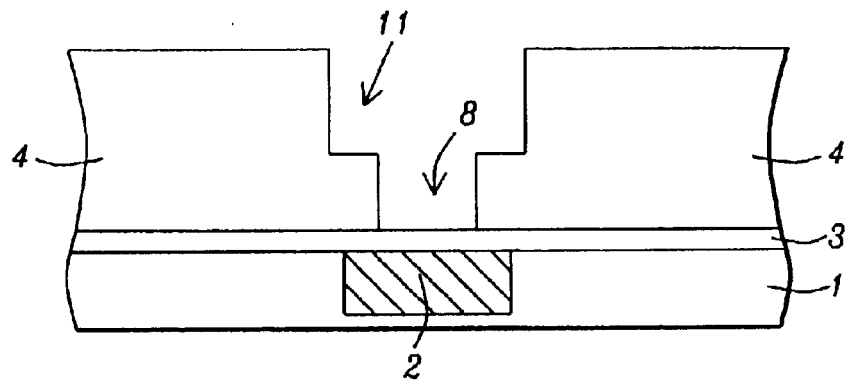
FIG. 1d – Prior Art
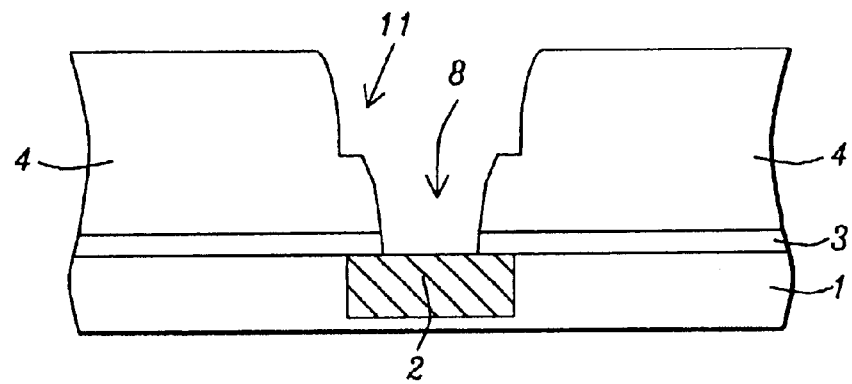
FIG. 1e – Prior Art
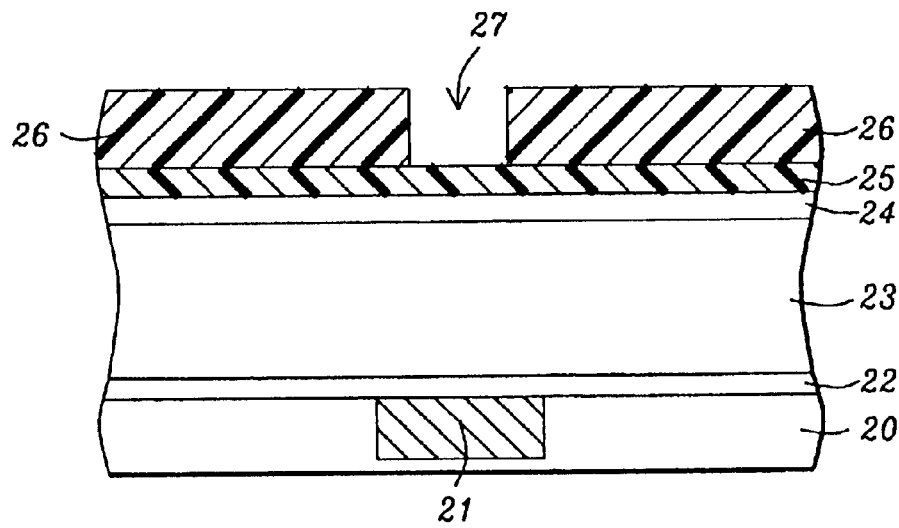
FIG. 2a

METHOD TO FORM CU/OSG DUAL DAMASCENE STRUCTURE FOR HIGH PERFORMANCE AND RELIABLE INTERCONNECTS

FIELD OF THE INVENTION

The invention relates to the field of fabricating integrated circuits and other electronic devices and in particular to a method of forming dual damascene structures for high performance and improved reliability.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating or dielectric materials to prevent crosstalk between the metal wiring that can degrade device performance. A popular method of forming an interconnect structure is a dual damascene process in which vias and trenches are filled with metal in the same step. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulating materials to avoid capacitance coupling between the metal interconnects.

Current technology involves forming vias and trenches that have sub-micron dimensions which can be 0.25 microns or less in width. One of the more promising low k dielectric materials is organosilicate glass (OSG) which is a silicon oxide that is doped with carbon and hydrogen atoms. While $SiO_2$ which has been traditionally used as a dielectric material in older technologies has a dielectric constant of about 4, OSG has a k value between 2 and 3 and thereby provides a much needed reduction in capacitance coupling between wiring. OSG is available as Black Diamond™ from Applied Materials, CORAL™ from Novellus, or can be obtained by different trade names from other manufacturers.

One of the problems associated with OSG is that the material is susceptible to damage during commonly used etching and cleaning steps. For instance, a photoresist layer is typically patterned above the OSG dielectric layer in a damascene process. A via hole or trench opening in the photoresist pattern is then etch transferred into the OSG layer. Typically, the photoresist is stripped with an oxygen containing plasma in a subsequent step. However, the oxygen plasma is capable of etching the sidewalls of the pattern in the OSG layer as it reacts with carbon and hydrogen atoms. This reaction can readily increase the critical dimension (CD) of the opening and transform a vertical sidewall into an undesirable sloped sidewall. This issue is addressed in U.S. Pat. No. 6,426,304 where a $H_2/N_2$ plasma is employed to strip a photoresist above an OSG layer. According to an FTIR analysis, there is less than a 2.5% change in OSG composition after the plasma treatment.

In U.S. Pat. No. 6,168,726, an oxidized organosilane dielectric layer is etched with a fluorocarbon and inert gas based plasma on a pedestal electrode that is RF biased. Optionally, a carbon volatilizing gas such as $O_2$ or $N_2$ is added in a second step.

A method of protecting an OSG layer is described in U.S. Pat. No. 6,410,426 in which a $Ti_{(1-x)}Al_xN$ capping layer is deposited on an OSG dielectric layer in a damascene scheme and functions as a hard mask during an etch sequence that includes an OSG etch with $C_4F_8$, $N_2$, and CO plasma.

Yet another method of preventing degradation in a low k dielectric layer such as OSG is found in U.S. Pat. No. 6,331,479. Two etch stop layers are formed between a first and second dielectric layer and two cap layers are deposited on the second dielectric layer while forming a metal interconnect. This scheme is likely to be costly because of additional layers and extra process steps.

Another concern with using OSG in a damascene structure is that the etch rate of OSG is close to that of a silicon carbide capping layer that is often used between the conductive layer and dielectric layer in a damascene stack. A representative process flow is depicted in FIGS. 1a–1e that demonstrates a serious issue with an OSG dielectric layer. Referring to FIG. 1a, a substrate 1 is provided that contains a conductive layer 2 and active and passive devices (not shown). A silicon carbide layer 3 is deposited by a chemical vapor deposition (CVD) technique and serves to protect conductive layer 2 during subsequent processing steps. An OSG layer 4 is deposited by a CVD or plasma enhanced CVD method on silicon carbide layer 3. A bottom anti-reflective coating (BARC) 6 is typically spin-coated or CVD deposited on OSG layer 4 in order to improve the process window in a subsequent photoresist patterning step. Next, a photoresist layer 7 is coated and patterned to form a via opening 8.

Referring to FIG. 1b, the via opening 8 is etched through BARC layer 6 and OSG dielectric layer 4 and stops on silicon carbide layer 3. Photoresist layer 7 and BARC 6 are stripped and then a wet clean step is used to remove any residues within via hole 8.

In FIG. 1c, a BARC 9 is spin coated on dielectric layer 4 and some partially fills via hole 8. The BARC 9 is usually hardened by baking to about 225° C. so that it becomes inert towards a photoresist layer 10 which is then coated and patterned to form a trench opening 11 above via hole 8.

Referring to FIG. 1d, the trench pattern 11 is etched into OSG layer 4 to a predetermined distance that is less than the depth of via hole 8. Photoresist layer 10 and BARC 9 are removed and a wet clean step is used to remove any residues from via hole 8 and trench opening 11.

In FIG. 1e, the exposed portion of silicon carbide layer 3 in via hole 8 is removed by a plasma etch that typically contains a fluorocarbon gas. However, the plasma also attacks the OSG layer 4 along the sidewalls of via hole 8 and trench 11 because of the carbon and hydrogen content in OSG layer 4. This reaction causes the top corners of trench 11 and via hole 8 to become rounded and the sidewalls become sloped as OSG layer 4 is etched away. Moreover, the horizontal surface of trench 11 is pitted. As a result, the CD of the via hole 8 and trench 11 are increased because of the loss of OSG layer 4 and this causes a loss of reliability in the final device. Therefore, an improved method of forming a dual damascene structure containing an OSG dielectric layer is needed to achieve the desired interconnect performance in new technologies.

Other efforts to improve the processing capabilities with an OSG dielectric layer are described in U.S. Pat. No. 6,410,437. A via hole is etched through an OSG layer and stops on a silicon carbide layer. First a low selectivity etchant removes a majority of the exposed OSG layer to transfer the hole opening and then a high selectivity etchant which is a plasma derived from a mixture of Ar, $N_2$, and $C_4F_8$ completes the via etch. U.S. Pat. No. 6,107,192 describes a reactive preclean process prior to metallization for sub-0.25 micron applications. A soft plasma etch including fluorine and oxygen radicals cleans $SiO_2$ based dielectric layers. A second step involving hydrogen radicals reacts with metal oxide residues to produce a clean metal surface and water as a by-product.

SUMMARY OF THE INVENTION

An objective of the present invention is to provide a method of forming a dual damascene structure containing an organosilicate glass dielectric layer that does not have damage to top corners of a via or trench.

A further objective of the present invention is to provide better CD and profile control for via and trench formation in a dual damascene structure containing an organosilicate glass dielectric layer.

A still further objective of the present invention is to minimize loss of an organosilicate dielectric layer during processing to form a dual damascene structure.

Yet another objective of the present invention is to eliminate pitting in an organosilicate glass dielectric layer that comprises the bottom of a trench in a dual damascene structure.

A still further objective of the present invention is to reduce polymer residue in a via and trench contained within an organosilicate glass dielectric layer in a dual damascene structure.

These objectives are achieved by modifying a via first approach in a dual damascene fabrication. A capping layer that is preferably silicon carbide is deposited on a substrate that typically contains an exposed conductive layer. An organosilicate (OSG) dielectric layer is deposited by a CVD or PECVD method. For example, Black Diamond™, CORAL™, or a similar material may be employed as the OSG layer. An optional hard mask may be applied on the OSG layer by a CVD or PECVD technique to complete the damascene stack. Next, a conformal bottom anti-reflective coating (BARC) is deposited by a spin coating or PECVD technique. After a photoresist is spin coated on the BARC, the photoresist layer is patterned to form a via hole that is aligned above the conductive layer in the substrate. The via opening is etch transferred through the BARC, hard mask, and OSG dielectric layer by a fluorocarbon containing etch process. The etch process is resumed to remove the exposed SiC layer in a soft manner without damaging or re-sputtering the underlying conductive layer or spoiling the initial via profile. The photoresist and BARC layers are then stripped. Subsequently, the substrate is treated to a wet clean to remove any residue.

The trench patterning sequence involves forming a planarizing BARC on the damascene stack that also partially fills the via hole. If the BARC is spin coated from an organic solution, the resulting BARC layer is hard baked to remove any residual solvent and render the BARC inert towards a subsequent photoresist patterning process. A photoresist layer is coated on the planarizing BARC and patterned to form a trench which is aligned above the via hole. The trench pattern is etch transferred through the hard mask and into the dielectric layer to a predetermined distance. Next, the photoresist layer and BARC layer are removed by a plasma stripping process. Care is taken to use a low temperature strip process to avoid damaging the exposed portion of the underlying conductive layer. At this point, any residues are removed with a wet clean. The substrate is treated with a reactive preclean (RPC) method known to those skilled in the art to eliminate any metal oxide formation on the conductive layer before a diffusion barrier liner is deposited on the sidewalls of the trench and via. Finally, a metal is deposited to fill the via and trench and is planarized so that it is coplanar with the OSG layer to complete the dual damascene structure.

In a second embodiment, a damascene stack is formed on a substrate with an exposed conductive layer and comprises a lower capping layer such as silicon nitride, a middle OSG dielectric layer, and an upper hard mask such as silicon oxynitride that also functions as a BARC. A photoresist layer is coated on the BARC and patterned to form a via hole that is aligned above the conductive layer in the substrate. The via hole is etch transferred through the BARC and OSG layer by a fluorocarbon etch process and then with a soft etch method through the lower cap layer. After the photoresist is stripped, the substrate is treated with a wet clean to remove any residues. The trench patterning sequence involves coating a planarizing BARC on the hard mask that also partially fills the via hole. A photoresist layer is then coated on the planarizing BARC and patterned to form a trench opening that is aligned above the via hole. A sequence is then followed that similar to the one described in the first embodiment to complete the dual damascene structure.

BRIEF DESCRIPTION OF THE DRAWINGS

FIGS. 1a–1e are cross-sectional views depicting a prior art method of forming a dual damascene structure containing an organosilicate glass dielectric layer.

FIGS. 2a–2c are cross-sectional views illustrating the formation of a via hole in a dual damascene structure according to a method of the present invention.

DETAILED DESCRIPTION OF THE INVENTION

Figure 2B:
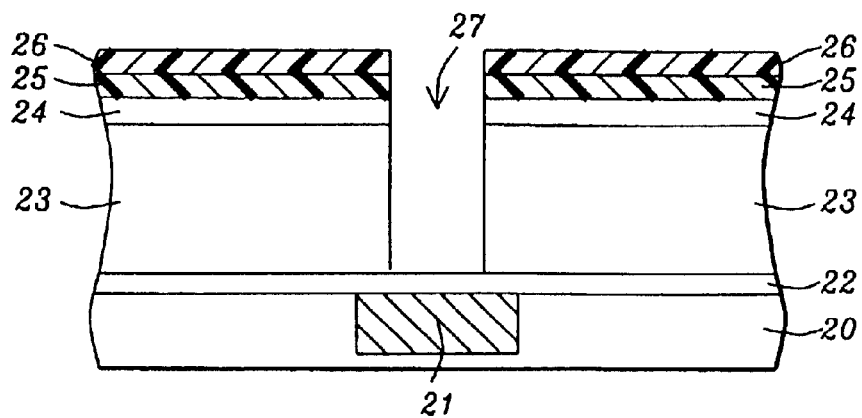

The present invention is particularly useful in forming a dual damascene structure that contains an OSG dielectric layer. The sequence of process steps is shown in a via first approach. A first embodiment is depicted in FIGS. 2a–2f. Although the figures depict a single OSG dielectric layer, it should be understood that the invention is also useful for a damascene stack that includes a capping layer on a substrate, a first OSG dielectric layer, an etch stop layer, and a second OSG dielectric layer on the etch stop.

Referring to FIG. 2a, a substrate 20 is provided that contains an exposed conductive layer 21 in an upper surface that will be used to construct a dual damascene structure. Substrate 20 is typically comprised of silicon or a silicon-germanium, gallium-arsenide, or silicon-on-insulator based technology. Substrate 20 is also comprised of active and passive devices that are not shown in order to simplify the drawings. Conductive layer 21 is preferably copper but may also be a Cu/Al alloy or tungsten and is typically enclosed on the sides and bottom by a diffusion barrier liner (not shown) within an insulating layer that is also not depicted.

A capping layer 22 that is preferably comprised of silicon carbide (SiC) is deposited on substrate 20 by a CVD or PECVD technique and has a thickness in the range of 300 to 1000 Angstroms. Next, an OSG layer 23 comprised of Black Diamond™, CORAL™, or a similar material is deposited by a CVD or PECVD process to a thickness between about 8000 and 12000 Angstroms. It should be understood that deposition tools from Applied Materials may be especially suited for depositing Black Diamond™ and that Novellus deposition tools may be optimized for depositing CORAL™. However, deposition tools from other sources can also be modified to produce an acceptable OSG layer 23. Note that the carbon and hydrogen content in the OSG layer 23 may vary depending upon process conditions but the present invention applies to all materials classified as "organosilicate glass".

An optional hard mask 24 is deposited on OSG layer 23 by a CVD or PECVD technique and is typically a material such as silicon oxide or silicon nitride. Layer 24 has a thickness in the range from about 300 to 1000 Angstroms. A conformal BARC 25 is then formed on hard mask 24 by a spin coating or PECVD method. A commercially available photoresist is then spin coated and baked to form a photoresist layer 26 on BARC layer 25. The refractive index (n and k) of BARC 25 is preferably optimized to reduce the reflection of light off hard mask 24 during the exposure of photoresist layer 26 and thereby increase the process window of the patterning process. Photoresist layer 26 is preferably a positive tone material and is patternwise exposed through a mask and then developed in an aqueous base solution to generate a via hole 27 that is aligned above conductive layer 21. Photoresist layer 26 has a thickness between about 2000 and 8000 Angstroms. Generally, the thickness of layer 26 is about 3 to 4 times the minimum feature size in the pattern which in this case is the width of via hole 27.

Referring to FIG. 2b, the via hole 27 is transferred through BARC 25, hard mask 24, and through OSG layer 23 in a plasma etch process that usually has two steps which are a non-selective fluorocarbon containing etch followed by a selective fluorocarbon containing etch which are known to those skilled in the art. The etch process stops on cap layer 22.

A key feature of the present invention is that cap layer 22 is removed prior to the photoresist strip and before formation of a trench in OSG layer 23. Since the SiC layer 22 and OSG layer 23 have a very similar etch rate, removal of SiC layer 22 exposed by via hole 27 at an early stage of the dual damascene structure avoids the problems associated with a conventional sequence in which a SiC cap layer is removed following trench formation. As shown in FIG. 1e, the conventional process in prior art leads to sloped sidewalls in the trench and via and damage to top corners of the trench and via. Furthermore, there is surface pitting in the bottom of the trench because the plasma that removes SiC also reacts with the carbon and hydrogen in the OSG layer. All these factors result in a loss of reliability in the final device that contains an OSG dielectric layer and is processed by a conventional process represented by FIGS. 1a–1e.

Figure 2C:
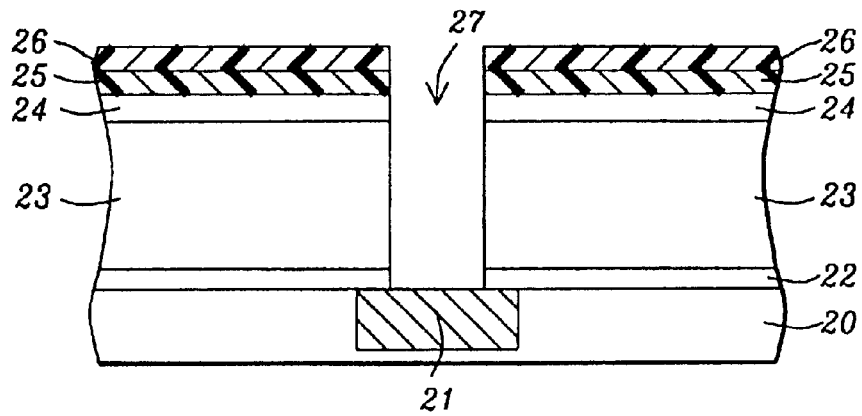

Referring to FIG. 2c, SiC layer 22 is removed by a soft plasma etch process without damaging or re-sputtering conductive layer 21. Preferred etch conditions include a plasma generated from $CH_2F_2$, $O_2$, and Ar, a chamber pressure of 40 to 80 mTorr, and a RF power of from 1 to 1.7 Watts/cm². However, any fluorocarbon $C_xH_yF_z$ where x=1, 2, y=1, 2, or 3, and z is an integer from 1 to 5 may be employed in place of $CH_2F_2$ in the gas mixture. Flow rates and chamber temperature are optimized for a particular etch tool and are not provided here. Since photoresist layer 26 serves as a protective mask during the SiC etch, OSG layer 23 is not damaged by the etchant. The sidewall of via 27 is almost vertical. When an end point is reached during etching of SiC layer 22, the plasma is stopped so as not to damage the exposed portion of conductive layer 21.

Photoresist layer 26 and BARC 25 are now stripped with a soft plasma etch in order not to damage OSG layer 23 or conductive layer 21. The etch step (not shown) comprises a low chamber temperature between about 10° C. and 60° C., an oxygen pressure of 15 to 150 mTorr, and a RF power of about 0.3 to 1.0 Watts/cm². A wet clean is then performed to remove residues within via hole 27. This step typically involves an RCA cleaning solution that is familiar to those skilled in the art.

Figure 2D:
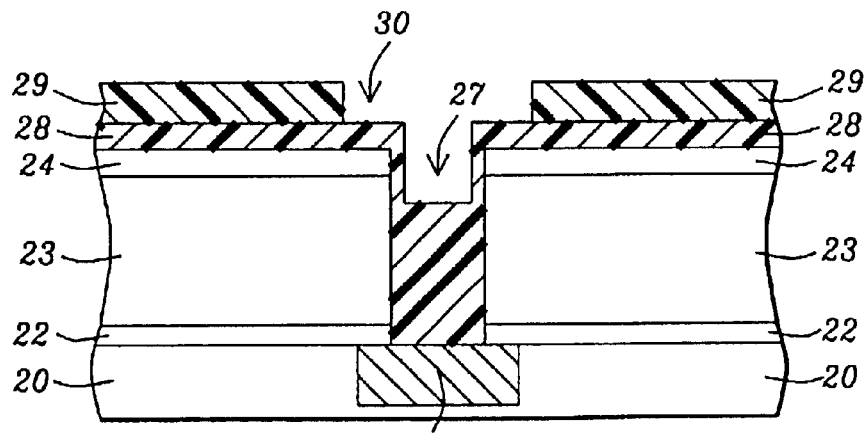
FIGS. 2d–2e are cross-sectional views depicting the formation of a trench pattern in a photoresist layer above the via hole in FIG. 2c.

Referring to FIG. 2d, a planarizing BARC 28 is deposited on hard mask 24. When the BARC is coated from an organic solution, the BARC 28 layer is baked at an elevated temperature of about 225° C. to remove residual solvent and render it inert towards a subsequent photoresist patterning process. BARC layer 28 preferably fills about 50% or more of via hole 27 and protects conductive layer 21 during subsequent trench patterning and etching steps. The BARC layer 28 may form a thin coating on the sidewall of hard mask 24 and on the sidewall of OSG layer 23 in the upper portion of via hole 27 even though the center of the via is not filled with BARC layer 28 at that level.

Next, a photoresist solution is spin coated and baked on BARC layer 28 to form a photoresist layer 29. The photoresist layer 29 is typically coated from the same solution as photoresist layer 26 and has a similar thickness in the range of about 2000 to 8000 Angstroms. The organic solvent in photoresist 29 does not mix with BARC layer 28 during the coating or baking steps used to form layer 29. Photoresist layer 29 is patternwise exposed and developed in an aqueous base to form a trench 30 that is aligned above via hole 27. The presence of BARC layer 28 helps to control reflectivity during the patterning process of photoresist 29. BARC layer 28 also enables a larger process window for patterning photoresist layer 29 because a more uniform thickness for layer 29 is achieved in the vicinity of via 27.

Figure 2E:
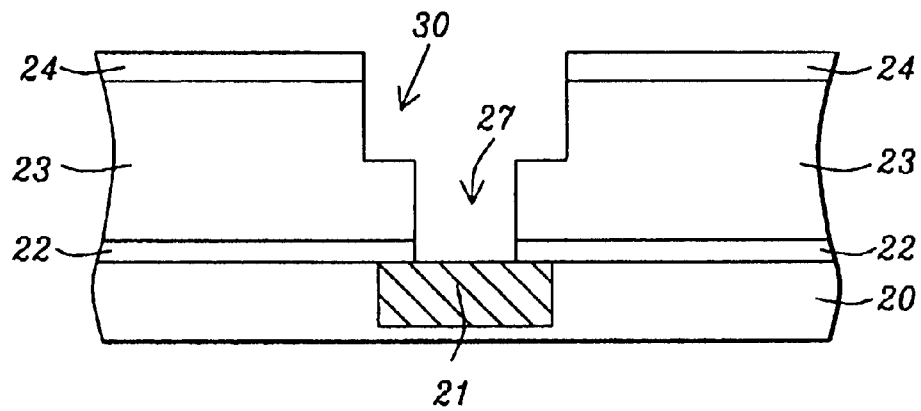

In FIG. 2e, trench 30 is transferred through BARC layer 28, hard mask 24 and partially through OSG layer 23 by a plasma etch process similar to that described for forming a via hole 27 in layers 25, 24, 23. The etch through OSG layer 23 is usually timed so that a prescribed thickness of OSG layer 23 is removed. The level of BARC layer 28 may also be lowered during the trench etch so that it is coplanar with the bottom of trench 30. In some cases, the remaining BARC layer 28 may be lower than the bottom of trench 30. The remaining portion of OSG layer 23 is not damaged by the trench etch process and nearly vertical sidewalls are produced in trench 30 which is an advantage over prior art where a cap layer at the bottom of a via hole is removed after the trench etch. Another advantage of the new dual damascene method of this invention is that there is no pitting in OSG layer 23 at the bottom of trench 30 since the SiC etch is performed before the trench 30 formation. The amount of OSG material lost during the trench etch is minimized relative to prior art methods because the selectivity of BARC 28 and photoresist 29 to OSG layer 23 in the present invention is much higher than the selectivity of SiC to OSG as depicted in FIG. 1e.

Photoresist layer 29 and remaining BARC layer 28 are then stripped by an oxygen plasma etch that was described previously for removal of photoresist layer 26 and BARC 25. Care is taken not to over etch the BARC layer 28 at the bottom of via hole 27 in order to prevent damage to the exposed conductive layer 21. The resulting sidewalls of via 27 are vertical and the CD in via hole 27 is close to that originally printed in photoresist layer 26 which is an improvement over prior art. Corner damage to via 27 is completely eliminated since the top corners are protected by a photoresist mask 26 during the SiC etch. Furthermore, this method produces less polymer residue in trench 30 and via 27 than a conventional process in which a SiC etch stop layer is etched after trench and via formation. After the photoresist layer 29 and BARC layer 28 are stripped, a standard RCA wet clean is performed to remove any residues.

Since the low temperature photoresist strip after the trench etch creates some oxide on the surface of conductive layer 21, the resulting metal oxide is removed by a reactive pre-clean (RPC) step such as one described in U.S. Pat. No. 6,107,192 which is herein incorporated by reference. The RPC preferably takes place in the same tool in which a barrier metal layer 31 is deposited by a CVD or PECVD step in a following step.

Figure 2F:
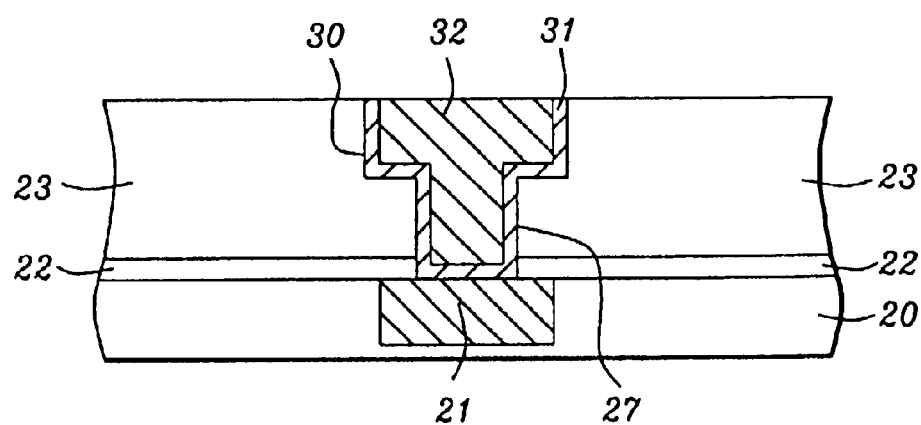
FIG. 2f is a cross-sectional view of a completed dual damascene structure according to the first embodiment of the present invention.

Referring to FIG. 2f, a conformal diffusion barrier liner 31 consisting of a material that is selected from a group including TaN, TaSiN, TiN, WN, W, Ta and Ti is deposited on the sidewalls and bottom of trench 30 and via 27. Finally, a metal 32 such as Cu, Al, tungsten, or a Cu/Al alloy is deposited by a conventional method and is then planarized by a chemical mechanical polish (CMP) step, for example, to be coplanar with OSG layer 23 to complete the dual damascene structure.

Figure 3:
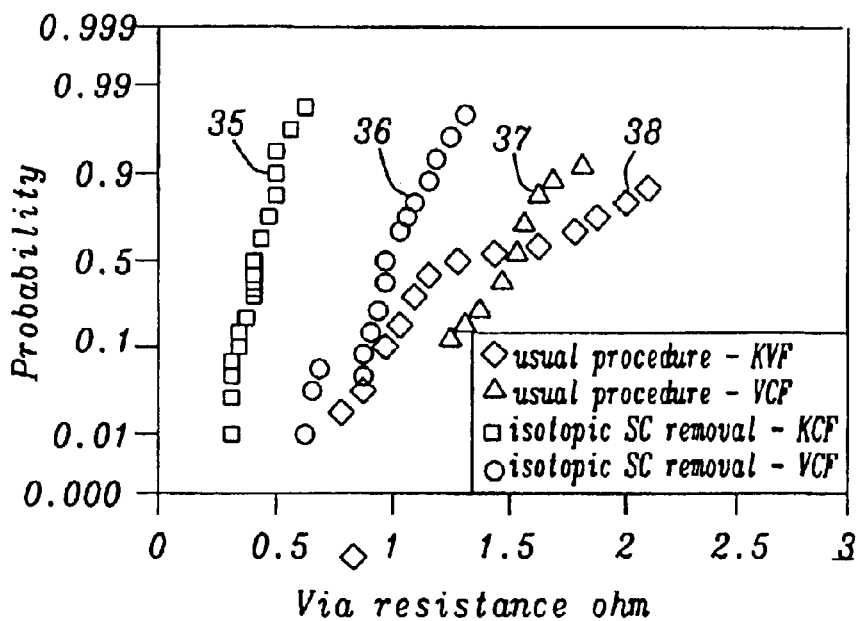
FIG. 3 is a plot showing the improvement in Kelvin via and via chain probability by implementing the dual damascene method of the present invention.

As shown in FIG. 3, the Kelvin via and via chain yield is significantly improved by implementing the new process of the present invention. Curves 35 and 36 that represent Kelvin via and via chain yield, respectively, for the new process show a higher yield probability than curves 37 and 38 that indicate the yields from a standard procedure.

An alternative via first approach for fabricating a dual damascene structure is illustrated in FIGS. 4a–4d as a second embodiment. Although the figures depict a single OSG dielectric layer, it should be understood that the invention is also useful for a damascene stack that includes a capping layer on a substrate, a first OSG dielectric layer, an etch stop layer, and a second OSG dielectric layer on the etch stop.

Figure 4A:
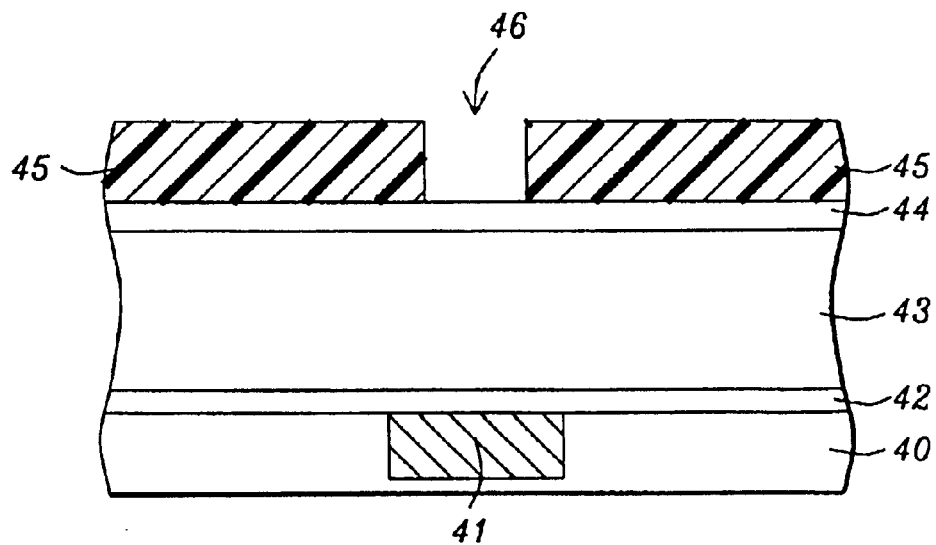
FIGS. 4a–4e are cross-sectional views of a via first sequence in forming a via and trench in a dual damascene scheme according to a second embodiment of the present invention.

Referring to FIG. 4a, a substrate 40 is provided that contains an exposed conductive layer 41 in an upper surface that will be used to construct a dual damascene structure. Substrate 40 is typically comprised of silicon or a silicon-germanium, gallium-arsenide, or silicon-on-insulator based technology. Substrate 40 is also comprised of active and passive devices that are not shown in order to simplify the drawings. Conductive layer 41 is preferably copper but may also be a Cu/Al alloy, Al, or tungsten and is typically enclosed on the sides and bottom by a thin diffusion barrier liner (not shown) that is within an insulating layer which is also not depicted.

A cap layer 42 comprised of a non-carbon containing material such as silicon nitride or silicon oxynitride is deposited on substrate 40 by a CVD or PECVD technique and has a thickness in the range of 300 to 1000 Angstroms. Next, an OSG layer 43 comprised of Black Diamond™, CORAL™, or a similar material is deposited by a CVD or PECVD process to a thickness between about 8000 and 12000 Angstroms. It should be understood that deposition tools from Applied Materials may be especially suited for depositing Black Diamond™ and that Novellus deposition tools may be optimized for depositing CORAL™. However, deposition tools from other sources can also be modified to produce an acceptable OSG layer 43. Note that the carbon and hydrogen content in the OSG layer 43 may vary depending upon process conditions but the present invention applies to all materials classified as "organosilicate glass".

A hard mask 44 is deposited on OSG layer 43 by a CVD or PECVD technique and is preferably comprised of a material such as silicon oxynitride. Hard mask 44 has a thickness in the range from about 300 to 1000 Angstroms and has the additional property that it can function as a BARC layer in order to eliminate the BARC layer 25 depicted in the first embodiment and thereby shorten the fabrication process. A commercially available photoresist is then spin coated and baked to form a photoresist layer 45 on hard mask 44. Photoresist layer 45 has a thickness between about 2000 and 8000 Angstroms. Photoresist layer 45 is preferably a positive tone material and is patternwise exposed through a mask and then developed in an aqueous base solution to generate a via hole 46 that is aligned above conductive layer 41. Since hard mask 44 also serves as a BARC, the process window for patterning photoresist 45 is improved.

Figure 4B:
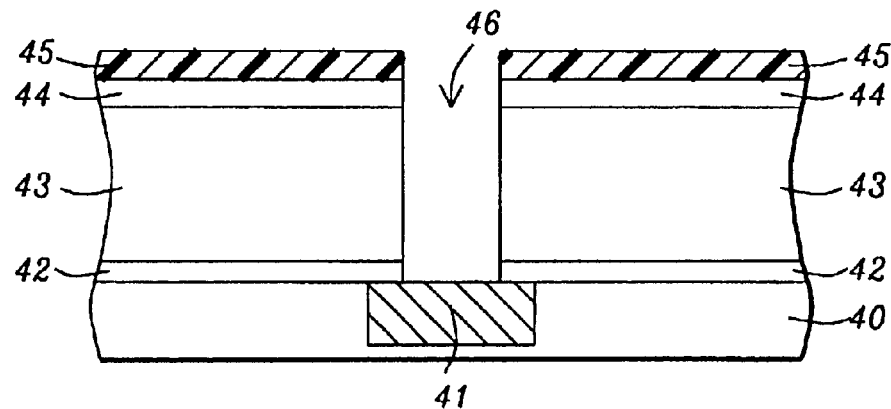

Referring to FIG. 4b, the via hole 46 is transferred through hard mask 44 and through OSG layer 43 with a plasma etch process comprised of a fluorocarbon in the gas mixture. The etch process stops on cap layer 42. The critical dimension (CD) which is the width of via hole 46 formed in photoresist layer 45 is close to the CD for via hole 46 in OSG layer 43.

A key feature of the present invention is that cap layer 42 is removed prior to the photoresist strip and before formation of a trench in OSG layer 43. Since the cap layer 42 and OSG layer 43 have a similar etch rate, removal of cap layer 42 exposed by via hole 46 at an early stage of the dual damascene structure avoids the problems associated with a conventional sequence in which a cap layer is removed following trench formation. As shown in FIG. 1e, the conventional process in prior art leads to sloped sidewalls in the trench and via and damage to top corners of the trench and via. Furthermore, there is surface pitting in the bottom of the trench because the plasma that removes cap layer also reacts with the carbon and hydrogen in the OSG layer. All these factors result in a loss of reliability in the final device that contains an OSG dielectric layer in prior art.

Referring to FIG. 4b, cap layer 42 is removed by a soft plasma etch process without damaging or re-sputtering conductive layer 41. Preferred etch conditions include a plasma generated from $CH_2F_2$, $O_2$, and Ar, a chamber pressure of about 40 to 80 mTorr, and a RF power of from 1 to 1.7 Watts/cm$^2$. However, any fluorocarbon $C_xH_yF_z$ where x=1,2, y=1–3, z=1–5 may be employed in place of $CH_2F_2$ in the gas mixture. Flow rates and chamber temperature are optimized for a particular etch tool and are not provided here. Since photoresist layer 45 serves as a mask during etching of cap layer 42, hard mask 44 and OSG layer 43 are not damaged by the etchant. The sidewall of via 46 is almost vertical. When end point is reached during etching of cap layer 42, the etch is stopped to avoid damaging the exposed portion of conductive layer 41.

Photoresist layer 45 is now stripped with a soft plasma etch in order not to damage OSG layer 43. The etch step (not shown) comprises a low chamber temperature between about 10° C. and 60° C., an oxygen pressure of 15 to 150 mTorr, and a RF power of about 0.3 to 1.0 Watts/cm$^2$. A wet clean is then performed to remove residues within via hole 46. This step typically involves an RCA cleaning solution that is familiar to those skilled in the art.

Figure 4C:
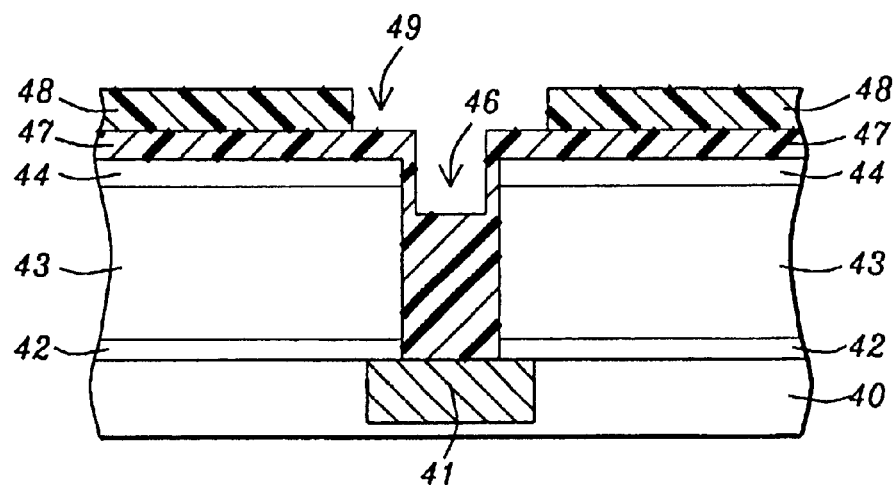
Figure 4D:
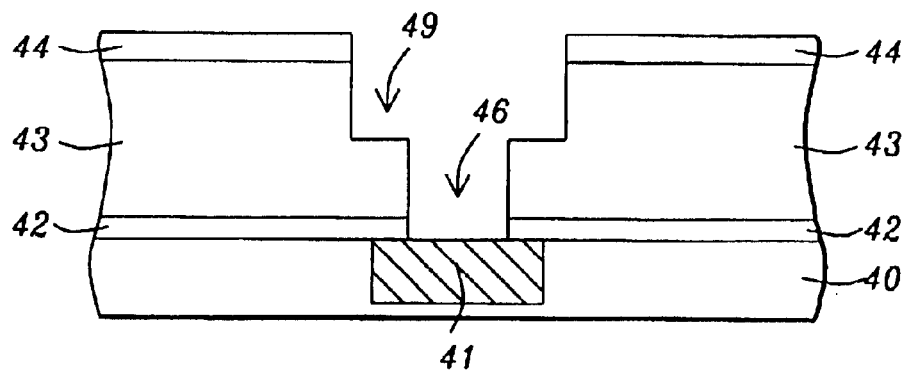
Figure 4E:
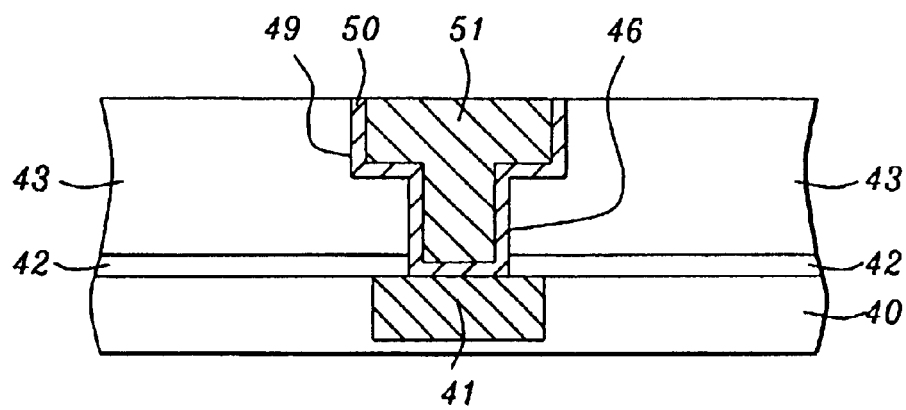

Referring to FIG. 4c, a planarizing BARC 47 is deposited on hard mask 44. When the BARC is coated from an organic solution, the BARC 47 layer is baked at an elevated temperature of about 225° C. to remove residual solvent and render it inert towards a subsequent photoresist patterning process. BARC layer 47 preferably fills about 50% or more of via hole 46 and protects conductive layer 41 during subsequent trench patterning and etching steps. The BARC layer 47 may form a thin coating on the sidewall of hard mask 44 and on the sidewall of OSG layer 43 in the upper portion of via hole 46 even though the center of the via is not filled with BARC layer 47 at that level.

Next, a photoresist solution is spin coated and baked on BARC layer 47 to form a photoresist layer 48. The photoresist layer 48 is typically coated from the same solution as photoresist layer 45 and has a similar thickness in the range of about 2000 to 8000 Angstroms. The organic solvent in photoresist 48 does not mix with BARC layer 47 during the coating or baking steps used to form layer 48. Photoresist layer 48 is patternwise exposed and developed in an aqueous base to form a trench 49 that is aligned above via hole 46. The presence of BARC layer 47 helps to control reflectivity during the patterning process of photoresist 48. BARC layer 47 also enables a larger process window for patterning photoresist layer 48 because a more uniform thickness for layer 48 is achieved in the vicinity of via hole 46.

In FIG. 4c, trench 49 is transferred through BARC layer 47, hard mask 44 and partially through OSG layer 43 by a plasma etch process similar to that described previously for forming a via hole 46 in layers 44, 43. The etch into OSG layer 43 is usually timed so that a prescribed thickness of OSG layer is removed. The level of BARC layer 47 may also be lowered during the trench etch so that it is coplanar with the bottom of trench 49. In some cases, the BARC layer 47 may be lower than the bottom of trench 49. The remaining portion of OSG layer 43 is not damaged by the trench etch process and nearly vertical sidewalls are produced in trench 49 which is an advantage over prior art where a cap layer at the bottom of a via hole is removed after the trench etch. Another advantage of the new dual damascene method of this invention is that there is no pitting in OSG layer 43 at the bottom of trench 49 since the cap etch is performed before the trench 49 formation. The amount of OSG material lost during the trench etch is minimized relative to prior art methods because the selectivity of photoresist 48 and BARC 47 to OSG layer 43 in the present invention is higher than the selectivity of SiC to OSG as depicted in FIG. 1e.

Photoresist layer 48 and remaining BARC layer 47 are then stripped by an oxygen plasma etch that was described previously for removal of photoresist layer 45. Additionally, hard mask 44 may be removed during the process that removes layers 47, 48. Care is taken not to overetch the BARC layer 47 at the bottom of via hole 46 to avoid damaging the exposed conductive layer 41. The resulting sidewalls of via 46 are vertical and the CD in via hole 46 is close to that originally printed in photoresist layer 45 which is an improvement over prior art. Corner damage to via hole 46 is completely eliminated since the top corners are protected by a photoresist mask 45 during the cap layer 42 etch. Furthermore, this method produces less polymer residue in trench 49 and via hole 46 than a conventional process in which a cap layer is etched after trench and via formation. After the photoresist layer 48 and BARC layer 47 are stripped, a standard RCA wet clean is performed to remove any residues.

Since the low temperature photoresist strip after the trench etch creates some oxide on the surface of conductive layer 41, the resulting metal oxide is removed by a reactive pre-clean (RPC) step described in the first embodiment. The RPC preferably takes place in the same deposition tool in which a barrier metal layer (not shown) is deposited by a CVD or PECVD step in a following step. The dual damascene structure is completed by sequentially depositing a diffusion barrier liner 50 and metal layer 51 as described in the first embodiment and planarizing the metal layer 51 so that it is coplanar with OSG layer 43. Note that the planarization step also removes any remaining hard mask layer 44.

As shown in FIG. 3, the Kelvin via and via chain yield is significantly improved by implementing the new process of the present invention according to the second embodiment. Curves 35 and 36 that represent Kelvin via and via chain yield, respectively, for the new process show a higher yield probability than curves 37 and 38 that indicate the yields from a standard procedure.

While this invention has been particularly shown and described with reference to, the preferred embodiments thereof, it will be understood by those skilled in the art that various changes in form and details may be made without departing from the spirit and scope of this invention.

We claim:
1. A dual damascene method, comprising:
(a) providing a substrate with a stack of layers formed thereon, said stack comprising a bottom cap layer and an upper organosilicate glass (OSG) dielectric layer;
(b) coating a photoresist layer on said stack and patterning to form a via hole in said photoresist;
(c) transferring said via hole through said OSG layer with a plasma etch process;
(d) removing said bottom cap layer exposed by said via hole;
(e) removing said photoresist by a soft etch process;
(f) forming a planarizing bottom anti-reflective coating (BARC) on said stack and in said via hole and patterning a trench in a photoresist layer on said planarizing BARC, said trench is aligned above said via hole;
(g) transferring said trench into said OSG dielectric layer;
(h) removing said planarizing BARC and said photoresist by a soft etch process; and
(i) depositing a barrier metal liner on the sidewalls and bottom of said trench and via hole and then filling said trench and via with a metal.

2. The method of claim 1 further comprised of forming a hard mask that is silicon oxide, silicon nitride, or silicon oxynitride on said OSG layer before coating said photoresist and forming a via hole.

3. The method of claim 1 further comprised of forming a BARC on said stack before coating a photoresist and patterning to form a via hole.

4. The method of claim 1 wherein said bottom cap layer is silicon carbide (SiC) that has a thickness from about 300 to 1000 Angstroms.

5. The method of claim 1 wherein said OSG layer is Black Diamond™ from Applied Materials, CORAL™ from Novellus, or a similar OSG material that has a thickness from about 8000 to 12000 Angstroms.

6. The method of claim 1 wherein said bottom cap layer is removed by a plasma etch process comprising a fluorocarbon $C_xH_yF_z$ where x=1, 2, y=1, 2, or 3, and z is an integer from 1 to 5, oxygen, and argon, a chamber pressure of about 40 to 80 mTorr, and a RF power of about 1 to 1.7 Watts/cm².

7. The method of claim 6 wherein the fluorocarbon is $CH_2F_2$.

8. The method of claim 1 wherein said soft etch process to remove said photoresist layers and BARC layer is comprised of an $O_2$ pressure of about 15 to 150 mTorr, a RF power from about 0.3 to 1.0 Watts/cm², and a chamber temperature of about 10° C. to 60° C.

9. The method of claim 8 further comprised of a wet clean step following the plasma strip to remove any residues.

10. The method of claim 1 wherein said planarizing BARC partially fills about 50% or more of said via hole and is inert toward said photoresist that is used to form a trench opening.

11. The method of claim 1 further comprised of a reactive plasma clean of said substrate following the removal of said planarizing BARC in said via hole.

12. The method of claim 1 wherein said barrier metal liner is TaN, TaSiN, TiN, WN, W, Ta or Ti and said metal layer is Cu, Al/Cu, Al, or tungsten.

13. A dual damascene method, comprising:
(a) providing a substrate with a stack of layers formed thereon, said stack comprising a bottom silicon carbide (SiC) cap layer and an upper OSG dielectric layer;
(b) forming a BARC on said stack and patterning a via hole in a photoresist layer on said BARC;
(c) transferring said via hole through said BARC and OSG layer with a plasma etch process;

(d) removing said SiC cap layer exposed by said via hole;

(e) removing said photoresist and BARC with a soft etch process;

(f) forming a planarizing BARC on said stack and in said via hole and patterning a trench in a photoresist layer on said planarizing BARC, said trench is aligned above said via hole;

(g) transferring said trench into said OSG dielectric layer; and (h) removing said planarizing BARC and said photoresist with a soft etch process.

14. The method of claim 13 further comprised of performing a reactive pre-clean (RPC) step on said substrate after said planarizing BARC is removed, depositing a barrier metal layer on the sidewalls and bottom of said trench and via, depositing a metal to fill said trench and via, and planarizing said metal to complete the dual damascene structure.

15. The method of claim 13 wherein said stack is further comprised of a hard mask that is silicon oxide, silicon nitride, or silicon oxynitride which is deposited on said OSG layer before forming a BARC and patterning said photoresist to generate a via hole.

16. The method of claim 13 wherein said OSG layer is Black Diamond™ from Applied Materials, CORAL™ from Novellus, or a similar OSG material and has a thickness from about 8000 to 12000 Angstroms.

17. The method of claim 13 wherein said bottom cap layer is removed by a plasma etch process comprising a fluorocarbon $C_xH_yF_z$ where x=1, 2, y=1, 2, or 3, and z is an integer from 1 to 5, oxygen, argon, a chamber pressure of about 40 to 80 mTorr, and a RF power of about 1 to 1.7 Watts/cm².

18. The method of claim 17 wherein the fluorocarbon is $CH_2F_2$.

19. The method of claim 13 wherein said soft etch process to remove said photoresist and BARC is comprised of an $O_2$ pressure of about 15 to 150 mTorr, a RF power from about 0.3 to 1.0 Watts/cm², and a chamber temperature of about 10° C. to 60° C.

20. The method of claim 13 further comprised of a wet clean step following the soft etch process to remove any residues.

21. The method of claim 13 wherein said planarizing BARC partially fills about 50% or more of said via hole and is inert toward said photoresist that is used to form a trench opening.

22. A dual damascene method, comprising:

(a) providing a substrate with a stack of layers formed thereon, said stack comprising a bottom cap layer, a middle organosilicate glass (OSG) dielectric layer, and a top hard mask that also functions as a BARC;

(b) patterning a photoresist layer on said hard mask to form a via hole;

(c) transferring said via opening through said hard mask and OSG dielectric layer with a plasma etch process;

(d) removing said bottom cap layer exposed by said via hole;

(e) removing said photoresist layer with a soft etch process;

(f) depositing a planarizing BARC on said hard mask;

(g) patterning a photoresist layer on said planarizing BARC to form a trench that is aligned above said via hole;

(g) transferring said trench through said hard mask and into said dielectric layer with a plasma etch process; and (h) removing said photoresist layer and planarizing BARC with a soft etch process.

23. The method of claim 22 further comprised of performing a RPC step on said substrate after said planarizing BARC is removed, depositing a barrier metal layer on the sidewalls and bottom of said trench and via, depositing a metal to fill said trench and via, and planarizing said metal to complete the dual damascene structure.

24. The method of claim 23 wherein said hard mask is removed during the planarization step.

25. The method of claim 22 wherein said bottom cap layer is comprised of silicon carbide, silicon nitride, or silicon oxynitride.

26. The method of claim 22 wherein said OSG layer is Black Diamond™ from Applied Materials, CORAL™ from Novellus, or a similar OSG material and has a thickness from about 8000 to 12000 Angstroms.

27. The method of claim 22 wherein said bottom cap layer is removed by a plasma etch process comprising a fluorocarbon $C_xH_yF_z$ where x=1, 2, y=1, 2, or 3, and z is an integer from 1 to 5, oxygen, argon, a chamber pressure of about 40 to 80 mTorr, and a RF power of about 1 to 1.7 Watts/cm².

28. The method of claim 22 wherein said soft etch process to remove said photoresist layers and BARC is comprised of an $O_2$ pressure of about 15 to 150 mTorr, a RF power from about 0.3 to 1.0 Watts/cm², and a chamber temperature of about 10° C. to 60° C.

29. The method of claim 22 further comprised of a wet clean step following said soft etch process to remove any residues.

30. The method of claim 22 wherein said planarizing BARC partially fills about 50% or more of said via hole and is inert toward said photoresist that is used to form a trench opening.

* * * * *